(12) United States Patent
Nakano et al.

(10) Patent No.: US 7,186,285 B2
(45) Date of Patent: Mar. 6, 2007

(54) CHEMICAL FILTER ARRANGEMENT FOR A SEMICONDUCTOR MANUFACTURING APPARATUS

(75) Inventors: Hitoshi Nakano, Tochigi-Ken (JP); Kiyoshi Arakawa, Tochigi-Ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/186,953

(22) Filed: Jul. 22, 2005

(65) Prior Publication Data

US 2005/0268581 A1 Dec. 8, 2005

Related U.S. Application Data

(62) Division of application No. 10/298,549, filed on Nov. 19, 2002, now Pat. No. 6,924,877.

(30) Foreign Application Priority Data

Nov. 19, 2001 (JP) ............................. 2001-352565

(51) Int. Cl.
*B08B 15/02* (2006.01)
*B01D 35/30* (2006.01)
(52) U.S. Cl. .................... 55/385.1; 55/385.2; 96/132; 454/187; 355/30; 355/53; 422/112; 422/122; 210/91; 250/311; 250/492.1
(58) Field of Classification Search ............... 55/385.1, 55/385.2; 96/132; 454/187; 355/30, 53, 355/55; 422/122, 112; 210/91; 250/492.1, 250/311
See application file for complete search history.

(56) References Cited

U.S. PATENT DOCUMENTS 4,609,459 A  9/1986 Hendrix 4,737,173 A  4/1988 Kudirka et al.

(Continued)

FOREIGN PATENT DOCUMENTS

| JP | 07-236814 | 9/1995 |
|---|---|---|
| JP | 09-220426 | 8/1997 |
| JP | 10106939 | 4/1998 |
| JP | 10-277364 | 10/1998 |
| JP | 11-111593 | 4/1999 |
| JP | 2000068193 | 3/2000 |
| JP | 2002093688 | 3/2002 |

OTHER PUBLICATIONS

European Search Report in Application No. 02257942.9-2208- (Nov. 21, 2003).

(Continued)

*Primary Examiner*—Minh-Chau T. Pham
(74) *Attorney, Agent, or Firm*—Fitzpatrick, Cella, Harper & Scinto

(57) ABSTRACT

Disclosed is a semiconductor exposure apparatus which includes a chamber for accommodating therein a main unit of the exposure apparatus, a gas controlling unit for controlling a gas in the chamber, a chemical filter for attracting a chemical substance in a controlling gas, and a dust removing filter for catching a dust particle in a controlling gas, wherein a gas blowing area of the chemical filter is smaller than that of the dust removing filter wherein said chemical filter and said dust removing filter are disposed separately from each other. The chemical filter is mounted obliquely with respect to a direction of flow of a supplied gas. A gas rectifying device is disposed at a gas inlet side of the chemical filter and the dust removing filter. The chemical filter can be a pleat filter, and it is mounted so that the pleat thereof is orthogonal to the direction of flow of the supplied air.

4 Claims, 3 Drawing Sheets

U.S. PATENT DOCUMENTS

| | | | |
|---|---|---|---|
| 4,963,170 A * | 10/1990 | Weber et al. | 55/311 |
| 5,434,644 A | 7/1995 | Kitano et al. | |
| 5,626,820 A | 5/1997 | Kinkead et al. | |
| 5,685,895 A | 11/1997 | Hagiwara et al. | |
| 5,922,095 A | 7/1999 | Hustvedt et al. | |
| 6,102,977 A * | 8/2000 | Johnson | 55/385.2 |
| 6,297,871 B1 | 10/2001 | Hagiwara | |
| 6,432,177 B1 | 8/2002 | Dallas et al. | |
| 6,602,307 B2 * | 8/2003 | Poirier | 55/385.2 |
| 6,924,877 B2 * | 8/2005 | Nakano et al. | 355/30 |
| 2002/0036760 A1 | 3/2002 | Udagawa et al. | |
| 2002/0068524 A1 | 6/2002 | Nakagawa | |
| 2003/0035087 A1 | 2/2003 | Murayama | |

OTHER PUBLICATIONS

Keiko Kanzawa, Junichi Kitano, "A Semiconductor Device Manufacturer's Efforts For Controlling and Evaluating Atmospheric Pollution", 1995 IEEE/SEMI Advanced Semiconductor Manufacturing Conference pp. 190-193.

* cited by examiner

CHEMICAL FILTER ARRANGEMENT FOR A SEMICONDUCTOR MANUFACTURING APPARATUS This application is a division of U.S. application Ser. No. 10/298,549 filed Nov. 19, 2002 now U.S. Pat. No. 6,924,877, the entire content of which is incorporated herein by reference.

FIELD OF THE INVENTION AND RELATED ART

This invention relates to a semiconductor manufacturing system suitably usable in production of semiconductor devices, particularly, in a semiconductor exposure apparatus.

The manufacture of IC, LSI or liquid crystal panel include many processes to be executed for a substrate such as a semiconductor wafer substrate or a glass substrate. An exposure process (pattern printing process) among them is a very important process, being a pivot of the semiconductor manufacture. Exposure apparatuses such as stepper or scanner are known as an apparatus for performing this process.

As a resist material to be applied to a wafer, generally, there are high molecular films in which chemical reaction can be produced efficiently in response to irradiation with ionizing radiation, and chemical amplification resists in which a catalyst (acid) is produced by exposure and, through a baking process (PEB) image formation is carried out on the basis of the catalyst. In the chemical amplification resists, since the image formation is based on a catalyst, sensitivity improvements can be done easily. Therefore, recently, they are used prevalently as a resist for excimer laser light with which illuminance is not easily obtainable.

On the other hand, the catalyst produced by the exposure diffuses in the air or over the wafer surface and, additionally, through the execution of the baking process (PEB), the catalysis is accelerated. This causes deterioration of image profile. In consideration of it, when chemical amplification resist is used, it is necessary to control chemical contamination by basic gases such as amines or amides in the environmental ambience, from resist application and exposure to baking process (PEB).

On the other hand, exposure apparatuses use many optical components such as lenses or mirrors, as like an illumination optical system for projecting light from a light source to a reticle surface. With the shortening of exposure wavelength, there arises a problem of blurring of optical components irradiated with exposure light, causing a decrease of exposure amount on the wafer surface. The blurring materials may be organic compounds or ammonium sulfate $(NH_4)_2SO_4$. The blurring may be caused by deposition of ammonium ion $(HH_4)^+$ or sulfuric ion $(SO_4^{2-})$, or a compound of them, or an organic gas, upon an optical component as a photochemical reaction by irradiation with exposure light.

In order to meet the problems of surface unsolubilization of chemical amplification resists and blurring of optical components, conventionally, an impurity removing filter is mounted in an environment chamber for controlling temperature and humidity or dust in an ambience surrounding the main unit of an exposure apparatus, thereby to remove substances such as basic gas, sulfuric gas, or organic compound gas, for example, contained in the ambience.

The impurity removing filter may be a chemical filter using ion exchange fibers, an active carbon filter using active carbon particles or active carbon fibers, or a chemical filter in which an acidic substance or alkaline substance is added to an active carbon. An appropriate filter may be chosen in consideration of the type of the gas to be removed or the characteristics of the filter. Where different types of gases should be removed, different filters may be used in combination, each being best suited to a particular gas.

In usual environment chambers, a dust removing filter (e.g. ULPA) is mounted at the ceiling thereof, and a downflow is produced in the chamber. Where a chemical filter is to be introduced into such environment chamber, it is laid on the dust removing filter in the manner that it is placed upwardly of the dust removing filter with respect to the air supply. In this case, the chemical filter and the dust removing filter should have the same size. This results in enlargement of the required filter space which causes an increase in size of the apparatus. Also, in usual dust removing filters, because of its properties, in order to obtain a high dust removing efficiency, the filter has to be used at a filter-passage air flow velocity of 0.3 to 0.5 m/sec or less. As a result, a large filter area is required. A similar filter passage air flow velocity is required for chemical filters. Also, for replacement of chemical filters, since it should be done at the ceiling of the apparatus chamber, the replacement work is dangerous and poor in efficiency.

Chemical filters may be provided at any other position inside an environment chamber, or the size of the chemical filter may be enlarged. However, anyway, this leads to bulkiness of the apparatus.

As regards the surface structure of chemical filters, there are a honeycomb structure and a pleat structure. The pressure loss is very small such as 10 to 100 Pa, although it depends on the filter-passage air flow velocity.

On the other hand, in chemical filters, non-uniformness of flow velocity easily occurs in the same plane, causing variation in lifetime and, as a result, degradation of apparatus performance. This phenomenon is particularly notable when a pleat type chemical filter is used. It has been confirmed that this results from the relationship between the direction of flow or air upstream of the chemical filter and the direction of folds of the pleat.

SUMMARY OF THE INVENTION

It is an object of the present invention to solve at least one of the problems described above, and to provide a semiconductor manufacturing apparatus in which, through efficient disposition of a chemical filter, manufacture of higher-precision devices, reduction in size of the space required for the apparatus, and improvements in easiness of maintenance can be accomplished.

In accordance with the present invention, to achieve this object, there is provided a semiconductor exposure apparatus, comprising: a chamber for accommodating therein a main unit of said exposure apparatus; a gas controlling unit for controlling a gas in said chamber; a chemical filter for attracting a chemical substance in a controlling gas; and a dust removing filter for catching a dust particle in a controlling gas; wherein a gas blowing area of said chemical filter is smaller than that of said dust removing filter.

The chemical filter and the dust removing filter may preferably be disposed separately from each other.

The chemical filter may preferably be mounted obliquely with respect to a direction of flow of a supplied gas.

The apparatus may preferably further comprise gas rectifying means disposed at a gas inlet side of said chemical filter and said dust removing filter.

The gas rectifying means may preferably comprise gas dividing means which includes one of a louver structure and a honeycomb structure.

The chemical filter may preferably be a pleat filter, wherein said pleat filter may be mounted so that folds of the pleat thereof extend orthogonally to the direction of flow of the supplied air.

With the arrangement described above, turbulence flows on the filter surface can be avoided or reduced. Also, the space required for the apparatus is reduced, and easiness of maintenance is facilitated. As a result, the performance of the apparatus can be held for a long term, and effective utilization of the clean room is assured.

These and other objects, features and advantages of the present invention will become more apparent upon a consideration of the following description of the preferred embodiments of the present invention taken in conjunction with the accompanying drawings.

BREIF DESCRIPTION OF THE DRAWINGS

DESCRIPTION OF THE PREFERRED EMBODIMENTS

Preferred embodiments of the present invention will now be described with reference to the attached drawings.

Figure 1:
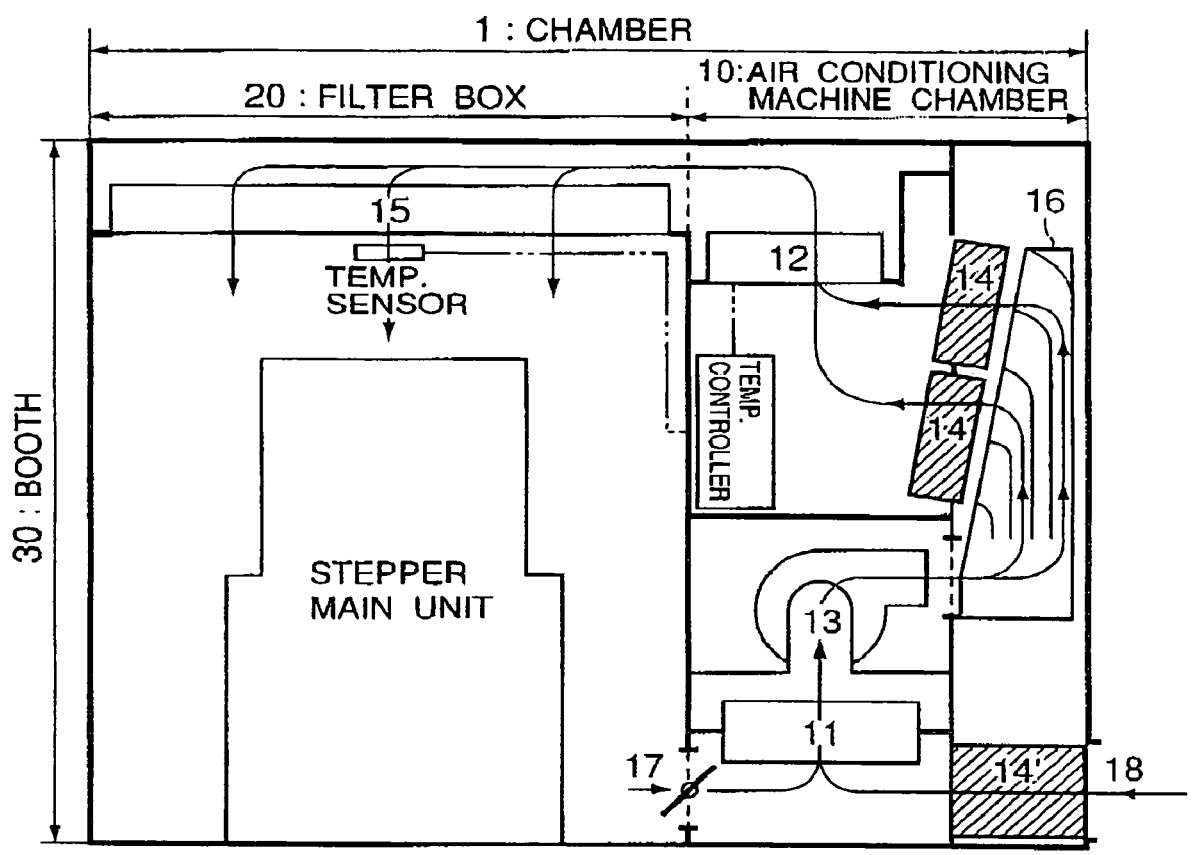
FIG. 1 is a schematic view of a semiconductor manufacturing apparatus according to an embodiment of the present invention.

FIG. 1 shows a general structure of an exposure apparatus. For the gas (air) conditioning of a main unit of this exposure apparatus, there is a chamber 1. This chamber 1 includes an air conditioning machine room 10 mainly for performing temperature control of the air, a filter box 20 for filtering small foreign particles to provide a uniform flow of clean airs, and a booth 30 for intercepting the apparatus environment from the outside.

In this chamber 1, an air which is temperature controlled by a cooling device 11 and a re-heater 12, disposed inside the air conditioning machine room 10, is supplied into the booth 30 by means of a blower 13 and through a chemical filter 14 and a dust removing filter 15. The air supplied into the booth 13 is caught by a return port 17 and, again, it is taken back to the air conditioning machine room 10 and thus circulated in the chamber 1.

Usually, this chamber 1 does not constitute a complete circulation system. Rather, in order to keep the inside of the booth 13 at a positive pressure, airs of about 5% to 10% of the circulation air quantity are introduced, from the outside atmosphere, by an outside air introducing port 18 and through an outside air introducing chemical filter 14' and a blower. The reason for keeping a positive pressure in the booth 13 is to prevent entry of small particles from the outside into the booth 13, through a small gap or gaps defined in the booth 13.

In the embodiment of FIG. 1, the chemical filter 14 is disposed separately from the dust removing filter 15 and, additionally, it is placed upstream of the dust removing filter 15. As regards the position of placement, taking into account the replacement of filters, it is desirable to choose a position where the maintenance operation can be done easily. Further, the air blowing area of the chemical filter is made smaller than that of the dust removing filter. For the chemical filter, the air blowing area can be reduced to about a half of that of the dust removing filter. This is because: it has been confirmed that, even if the filter-passage air flow velocity of the chemical filter is increased to 1 m/sec, the lifetime thereof is hardly deteriorated. This will be explained in more detail, with reference to FIG. 2.

Figure 2:
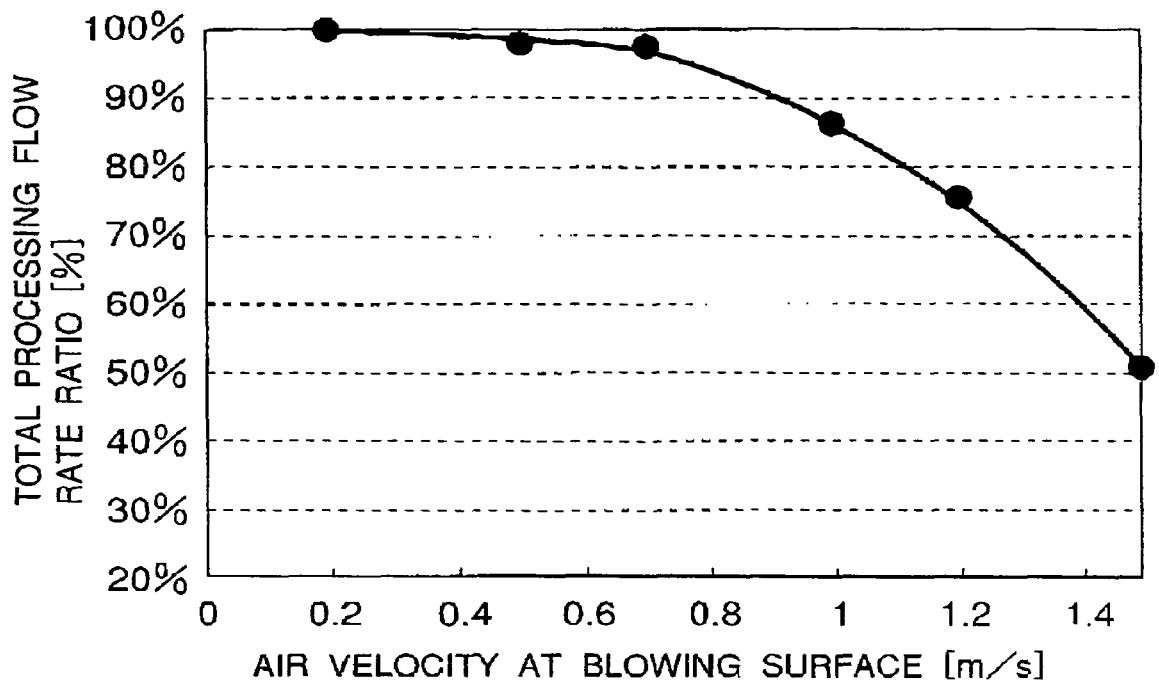
FIG. 2 is a graph for explaining the relationship between an air blowing rate and a lifetime of a chemical filter, determined by experiments.
Figure 3:
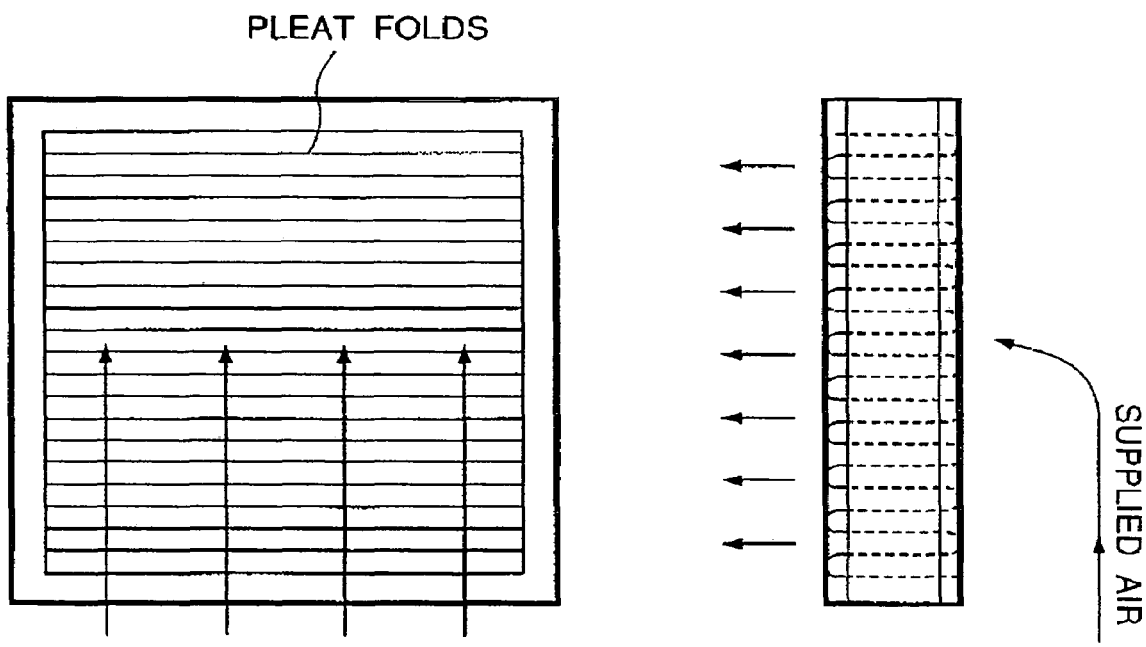
FIG. 3 is a schematic view, showing details of a pleat filter.
Figure 4:
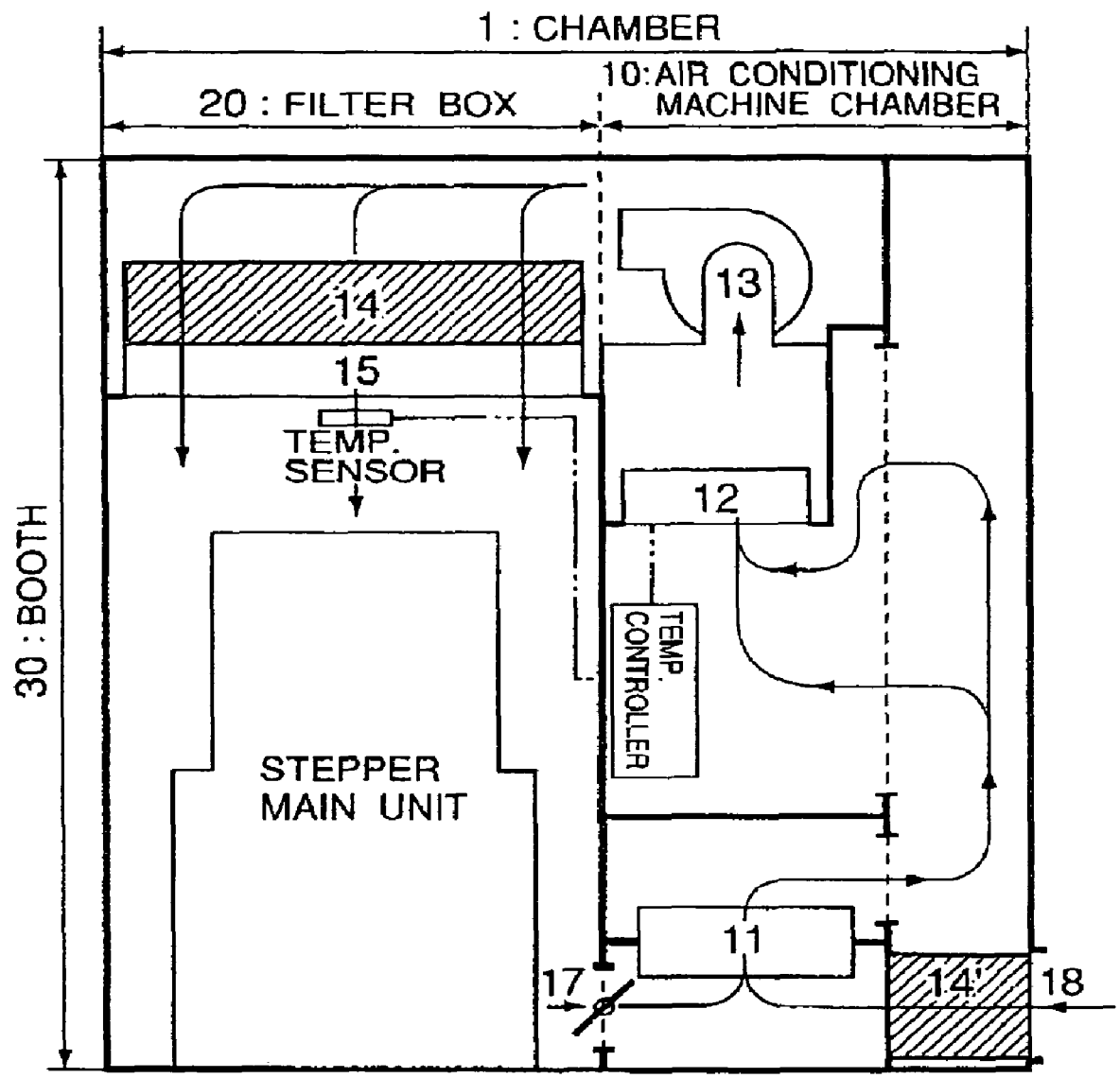
FIG. 4 is a schematic view of a conventional semiconductor manufacturing apparatus.

FIG. 2 shows an example of experimentally obtained results in respect to the relationship between the blowing air flow velocity and the total processing flow rate, under a certain impurity concentration environment, for a chemical filter. Here, the term "total processing flow rate" is defined as an integrated air flow rate processed in the period in which the removing rate of the chemical filter in a single path is kept not less than 90%. Also, in FIG. 2, the total processing flow rate when the blowing air flow velocity is sufficiently slow, at 0.2 m/s, is taken as a reference value, and the proportion with respect to it is illustrated at the axis of ordinate. As shown in FIG. 2, up to a blowing air flow velocity of 0.5 m/s, the total processing flow rate was hardly deteriorated. When the velocity became over 0.5 m/s, the total processing flow rate was gradually deteriorated. When the blowing air velocity was increased to 1.5 m/s, the total processing air flow rate was deteriorated to about 50%. Further, the deterioration rate of the total processing flow rate with the blowing air velocity of 1.0 m/s was about 12%. Thus, it has been found that, for example, as compared with a case where the blowing air velocity is set at 0.5 m/s, if the blowing are velocity is set at 1 m/s, the open area of the chemical filter can be made to a half; and also that, in order to obtain a total processing air flow rate exactly the same as the case of 0.5 m/s, only it is necessary to increase the total capacity (i.e. depth size) of the chemical filter just by 12%.

Further, the chemical filter 14 is disposed obliquely with respect to the flow of the supplied air. There is air rectifying means 16 such as a louver, for example, at the air entrance side of the filter. The filter may be a pleat filter and, in that case, the filter may be mounted so that the folds thereof extend in a direction orthogonal to the direction of flow of the supplied air.

With this arrangement, any turbulence flow of airs at the filter surface can be prevented or reduced and, additionally, supply of airs at uniform air amounts to the filters is assured. The size of the chemical filter, which is not at all small because of its removing efficiency, can be decreased by increasing the filter-passage air flow velocity. Further, it is disposed separately and obliquely, at an arbitrary position. This enables efficient utilization of the inside space of the apparatus.

Thus, in accordance with the present invention, it becomes possible to provide a semiconductor manufacturing apparatus in which a chemical filter is disposed separately from a duct removing filter and it is mounted obliquely with respect to the supplied air. Further, there is air flow rectifying means at the entrance side of the filter. Therefore, production of higher-precision devices is assured.

Moreover, the easiness of maintenance is facilitated and the size of the apparatus can be decreased. Thus, effective utilization of a clean room and reduction in equipment cost as well as improvement of production efficiency, are assured.

While the invention has been described with reference to the structures disclosed herein, it is not confined to the details set forth and this application is intended to cover such modifications or changes as may come within the purposes of the improvements or the scope of the following claims.

What is claimed is:

1. An apparatus, comprising:
   a dust removing filter disposed in a path of gas flow;
   a chemical filter disposed in the path upstream of the dust removing filter, obliquely with respect to the path, wherein an area of said chemical filter is smaller than an area of said dust removing filter; and
   a rectifier disposed in the path, upstream of said chemical filter, and having a shape to reduce nonuniformity of the gas flow through said chemical filter.

2. An apparatus according to claim 1, wherein said rectifier comprises one of a louver, a honeycomb structure, and a divider, configured to divide the gas flow.

3. An apparatus according to claim 1, further comprising an exposure unit configured to expose a substrate to a radiation, and a booth for accommodating said exposure unit therein, wherein the gas flow through said chemical filter and said dust removing filter is supplied into said booth.

4. An apparatus according to claim 1, wherein said rectifier comprises a divider for dividing the gas flow in a dividing direction, and wherein the dividing direction is substantially orthogonal to a direction of a pleat fold of said chemical filter.

* * * * *